United States Patent
Song et al.

(10) Patent No.: US 8,730,746 B2
(45) Date of Patent: May 20, 2014

(54) SEMICONDUCTOR INTEGRATED CIRCUIT

(75) Inventors: Keun Soo Song, Icheon-si (KR); Nak Kyu Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 200 days.

(21) Appl. No.: 13/340,766

(22) Filed: Dec. 30, 2011

(65) Prior Publication Data

US 2012/0195140 A1  Aug. 2, 2012

(30) Foreign Application Priority Data

Jan. 28, 2011 (KR) .................. 10-2011-0009077

(51) Int. Cl.
*G11C 7/00* (2006.01)

(52) U.S. Cl.
USPC ............... 365/191; 365/189.2; 365/189.03

(58) Field of Classification Search
USPC ............ 365/191, 189.05, 189.07, 189.15, 365/189.2, 230.06, 189.03
See application file for complete search history.

(56) References Cited

U.S. PATENT DOCUMENTS

| | | | |
|---|---|---|---|
| 6,173,425 B1* | 1/2001 | Knaack et al. | 714/718 |
| 6,351,681 B1* | 2/2002 | Chih et al. | 700/121 |
| 7,133,798 B1* | 11/2006 | Ong | 702/117 |
| 2012/0075944 A1* | 3/2012 | Ide et al. | 365/200 |
| 2012/0272112 A1* | 10/2012 | Oh et al. | 714/727 |

* cited by examiner

*Primary Examiner* — Gene Auduong
(74) *Attorney, Agent, or Firm* — William Park & Associates Patent Ltd.

(57) ABSTRACT

A semiconductor integrated circuit includes a first pad allocated to receive a row address, a second pad allocated to discriminate a first input/output mode and a second input/output mode, a detector configured to generate a detection signal in response to logic levels of the first and second pads, and a column address controller configured to deassert a column address to a logic low level in response to a deasserted detection signal. The semiconductor integrated circuit may selectively support one of first and second memory capacities and one of the first and second input/output modes using the logic levels of the first and second pads.

19 Claims, 3 Drawing Sheets

FIG.1

|  | Row Address | Column Address |
|---|---|---|
| X8_512M | A0~A13 | A0~A9 |
| X16_512M | A0~A12 | A0~A9 |
| X16_256M | A0~A12 | A0~A8 |

FIG.2

|  | IOX8 | A<13> |
|---|---|---|
| X8_512M | H | Use |
| X16_512M | L | Floating |
| X16_256M | L | Floating |

FIG.3

|  | IOX8 | A<13> |
|---|---|---|
| X8_512M | H | Use |
| X16_512M | L | H(VDD) |
| X16_256M | L | L(VSS) |

SEMICONDUCTOR INTEGRATED CIRCUIT

CROSS-REFERENCES TO RELATED APPLICATION

The present application claims priority under 35 U.S.C. §119(a) to Korean application number 10-2011-0009077 filed on Jan. 28, 2011 in the Korean Intellectual Property Office, which is incorporated by reference in its entirety.

BACKGROUND

1. Technical Field

The present invention relates to a semiconductor circuit, and more particularly, to a semiconductor integrated circuit.

2. Related Art

A semiconductor integrated circuit may be manufactured is with various memory capacities and input/output modes.

A conventional semiconductor integrated circuit such as, for example, DRAM may be configured as X8_512M, X16_512M, and X16_256M.

X8_512M is a 512 Mb DRAM with eight input/output data terminals DQ0 to DQ7. Similarly, X16_512M 512 Mb DRAM with 16 input/output terminals DQ0 to DQ15, and X16_256M is a 256 Mb DRAM with 16 input/output terminals DQ0 to DQ15.

According to a specification of the semiconductor integrated circuit as shown in FIG. 1, X8_512M uses row addresses A0 to A13 and column addresses A0 to A9, X16_512M uses row addresses A0 to A12 and column addresses A0 to A9, and X16_256M uses row addresses A0 to A12 and column addresses A0 to A8.

As shown in FIG. 1, when the number of column addresses is reduced by one bit, half of the X16_512 Mb DRAM may be operated as X16_256M.

A conventional semiconductor integrated circuit includes a pad IOX8 to select either a X8 or X16 input/output mode.

Referring to FIG. 2, X8_512M fixes the pad IOX8 to a logic high level, and X16_512M and X16_256M fix the pad IOX8 to a logic low level.

Furthermore, since X8_512M uses a row address A13, X8_512M controls the corresponding pad to receive the row address A13 from outside. Since X16_512M and X16_256M do not use the row address A13, X16_512M and X16_256M float the corresponding pad.

The conventional semiconductor integrated circuit uses a fuse circuit provided therein, in order to support various products such as X8_512M, X16_512M, and X16_256M. In particular, the fuse circuit is used to support 256 Mb DRAM using 512 Mb DRAM. That is, the type of a product may be defined by blowing a fuse of the fuse circuit or not.

However, the fuse cannot be restored to the original state after it is blown. That is, only 256 Mb of 512 Mb may be used after the corresponding fuse is blown.

Therefore, since the conventional semiconductor integrated circuit decides a memory capacity through a fuse, it is difficult to change the quantity of products shipped to deal with changing demand.

Whether or not to blow a fuse is determined during a probe test. In this state, it is difficult to estimate the demand, that is, determine whether to use 256 Mb or 512 Mb. Furthermore, the fuse may cause problems during a blowing process, thereby reducing the reliability of the semiconductor memory integrated circuit.

SUMMARY

A semiconductor integrated circuit capable of supporting various products without using a fuse is described herein.

In one embodiment of the present invention, a semiconductor integrated circuit includes a first pad allocated to receive a row address, a second pad allocated to discriminate a first input/output mode and a second input/output mode, a detector configured to generate a detection signal in response to logic levels of the first and second pads, and a column address controller configured to generate a column address at a logic low level in response to the detection signal, wherein the semiconductor integrated selectively supports one of first and second memory capacities and one of the first and second input/output modes using the logic levels of the first and second pads.

In another embodiment of the present invention, a method may comprise receiving a first signal via a first pad, receiving a second signal via a second pad allocated to discriminate between a first input/output mode and a second input/output mode, generating a detection signal in response to logic levels of the first and second pads, and generating a column address at a logic low level in response to a deasserted detection signal. One of first and second memory capacities may be selectively supported and one of the first and second input/output modes may be selectively supported using the first and second signals.

BRIEF DESCRIPTION OF THE DRAWINGS

Features, aspects, and embodiments are described in conjunction with the attached drawings:

FIG. 1 is a table showing an address specification of a semiconductor integrated circuit;

FIG. 2 is a table showing a pad setting method of a conventional semiconductor integrated circuit;

FIG. 3 is a table showing a pad setting method of a semiconductor integrated circuit according to one embodiment of the invention;

DETAILED DESCRIPTION

Figure 4:
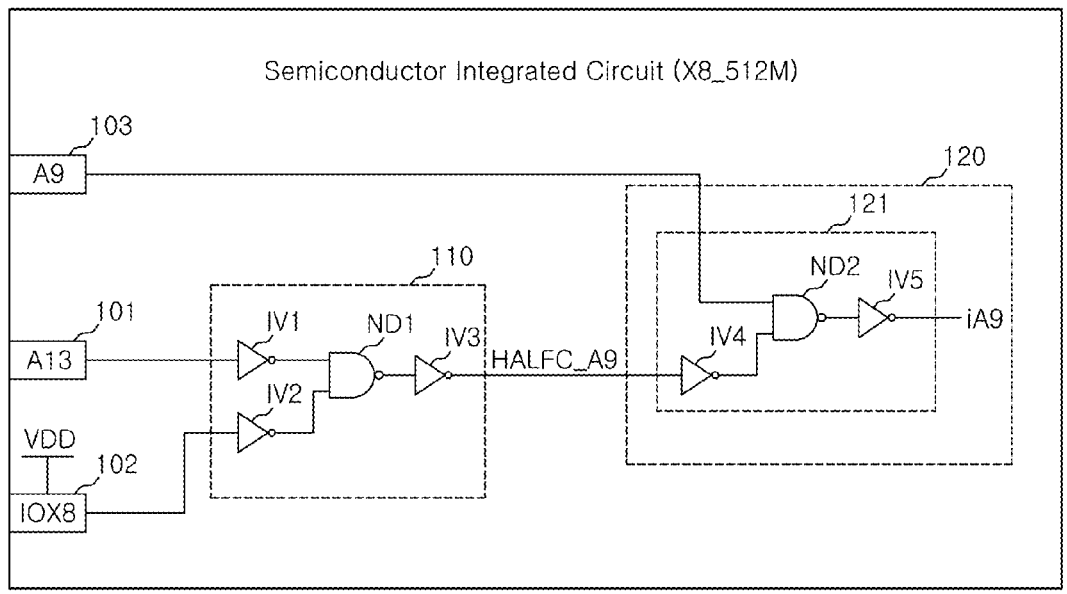
FIG. 4 is a block diagram of a semiconductor integrated circuit 100 according to an embodiment of the invention.

A semiconductor integrated circuit according to the present invention will be described below with reference to the accompanying drawings through exemplary embodiments.

A semiconductor integrated circuit according to one embodiment, for example, 512 Mb DRAM may support various product configurations such as, for example, X8_512M, X16_512M, and X16_256M.

At this time, X8_512M represents a 512 Mb DRAM using eight input/output terminals DQ0 to DQ7, X16_512M represents a 512 Mb DRAM using 16 input/output terminals DQ0 to DQ15, and X16_256M represents a 256 Mb DRAM using 16 input/output terminals DQ0 to DQ15.

The semiconductor integrated circuit according to an embodiment of the invention does not use a fuse circuit, but may support the above-described products through a pad bonding method.

As known from FIG. 1 showing the address specification of the semiconductor integrated circuit, X16_256M does not use the column address A9 while the X8_512M and X16_512M configurations do.

Therefore, in order to use a semiconductor integrated circuit as X16_256M, the semiconductor integrated circuit may be set so as not to use the column address A9.

The X8 type (X8_512M) and the X16 type (X16_512M and X16_256M) may be discriminated through a pad IOX8 for discriminating an input/output type (X8 or X16).

Furthermore, a row address A13 which is not used in X16_512M and X16_256M may be used to discriminate X16_512M and X16_256M from the X8_512M.

In the semiconductor integrated circuit according to an embodiment, logic levels of the pad IOX8 and a pad A13 receiving a row address are used as a signal for discriminating a particular I/O configuration X8_512M, X16_512M, or X16_256M for one semiconductor integrated circuit chip.

Furthermore, when a semiconductor integrated circuit is configured for the X16_256M configuration, the semiconductor integrated circuit is set so as not to use the column address A9.

First, referring to FIG. 3, X8_512M fixes the pad IOX8 to a logic high level, and X16_512M and X16_256M fix the pad IOX8 to a logic low level, during packaging of the semiconductor integrated circuit.

Furthermore, since X8_521M uses the row address A13, X8_512M controls the corresponding pad to receive the row address A13 from outside, and X16_512M and X16_256M fix the pads allocated to receive the row address A13 to a logic high level and a logic low level, respectively.

The fixing of the pad IOX8 to a logic high level may be performed by bonding the corresponding pad to a power supply voltage terminal VDD.

The fixing of the pad IOX8 to a logic low level may be performed by bonding the corresponding pad to a ground terminal VSS.

A circuit may use signals from the pad IOX8 and the row address A13 to control use of the column address A9 in the case of X16_512 and X16_256M. That circuit may be configured in a predetermined area (for example, a peripheral circuit area) inside the semiconductor integrated circuit.

According to the table of FIG. 3, the pad IOX8 and the row address A13 have a logic low level L for a X16_256M configuration.

Therefore, when both of the pad IOX8 and the row address A13 have a logic low level, an input of the column address A9 may be blocked.

FIG. 4 illustrates an X8_512M-type semiconductor integrated circuit 100. The semiconductor integrated circuit 100 includes pads 101 to 103, a detector 110, and a column address controller 120. The column address controller 120 includes an address blocking unit 121.

Since the X8_512M type uses the row address A13 as shown in FIG. 3, a pad A13 is configured to normally receive the row address A13 from outside, and a pad IOX8 is fixed to a logic high level.

The detector 110 includes a plurality of inverters IV1 to IV3 and a NAND gate ND1.

The detector 110 is configured to output a detection signal HALFC_A9 at a logic low level in response to the high-level pad IOX8.

The column address controller 120 is configured to control a column operation of the semiconductor integrated circuit in response to a column address inputted from outside.

The address blocking unit 121 includes a plurality of inverters IV4 and IV5 and a NAND gate ND2.

The address blocking unit 121 is configured to block an is input of the column address A9 in response to the detection signal HALFC_A9. That is, the address blocking unit 121 fixes an internal column address iA9 to a logic low level in response to an asserted detection signal HALFC_A9 at a high level, and receives the column address A9 as the internal column address iA9 in response to a deasserted detection signal HALFC_A9 at a low level.

In the X8_512M-type semiconductor integrated circuit 100, since the pad IOX8 is fixed to a logic high level, the detection signal HALFC_A9 becomes a logic low level such that the column address A9 is received as the internal column address iA9.

Figure 5:
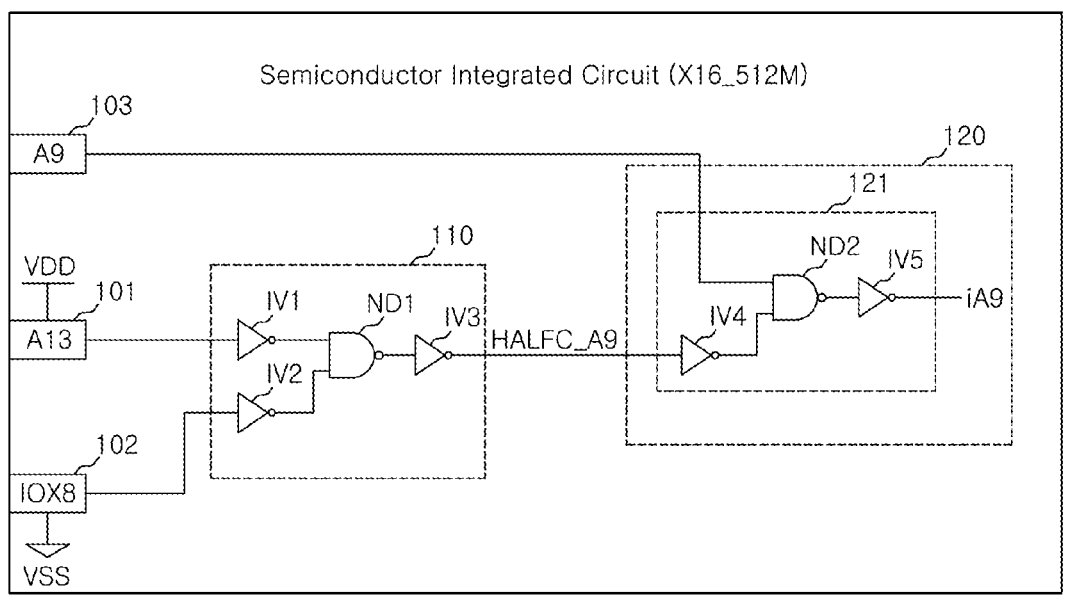
FIG. 5 is a block diagram of a semiconductor integrated circuit 101 according to an embodiment of the invention.

FIG. 5 illustrates an X16_512M-type semiconductor integrated circuit 101. The semiconductor integrated circuit 101 includes a plurality of pads 101 to 103, a detector 101, and a column address controller 120. The column address controller 120 includes an address blocking unit 121.

The detector 110, the column address controller 120, and the address blocking unit 121 may be similar to the circuit illustrated in FIG. 4.

For the X16_512M-type semiconductor integrated circuit 101 does not use the row address A13. Therefore, as shown in FIG. 3, the pad A13 is fixed to a logic high level and the pad IOX8 is fixed to a logic low level.

In the X16_512M-type semiconductor integrated circuit 101, since the pad A13 is fixed to a logic high level, the detection signal HALFC_A9 becomes a logic low level. Accordingly, the X16_512M-type semiconductor integrated circuit 101 receives the column address A9 as an internal column address iA9.

Figure 6:
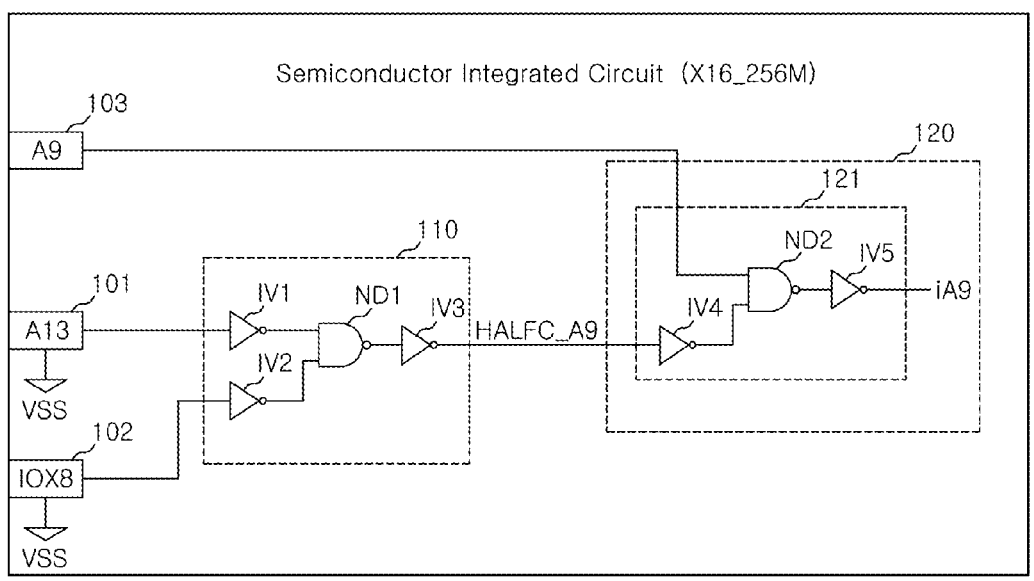
FIG. 6 is a block diagram of a semiconductor integrated circuit 102 according to an embodiment of the invention.

FIG. 6 illustrates an X16_256M-type semiconductor integrated circuit 102. The X16_256M-type semiconductor integrated circuit 102 includes a plurality of pads 101 to 103, a detector 110, and a column address controller 120. The column address controller 120 includes an address blocking unit 121.

The detector 110, the column address controller 120, and the address blocking unit 121 may be similar to the circuit illustrated in FIG. 4.

As illustrated in FIG. 3, since the X16_256M-type semiconductor integrated circuit 102 does not use the row address A13, the pad A13 is fixed to a logic low level, and the pad IOX8 is fixed to a logic low level.

In the X16_256M-type semiconductor integrated circuit 102, since both of the pad A13 and the pad IOX8 are fixed to a logic low level, the detection signal HALFC_A9 becomes a logic high level, which drives the internal column address iA9 to a logic low level.

According to the embodiment, since a fuse is not used, it is possible to improve the reliability and productivity of the semiconductor integrated circuit.

While certain embodiments have been described above, it will be understood to those skilled in the art that the embodiments described are by way of example only. Accordingly, the semiconductor integrated circuit described herein should not be limited based on the described embodiments. Rather, the semiconductor integrated circuit described herein should only be limited in light of the claims that follow when taken in conjunction with the above description and accompanying drawings.

What is claimed is:
1. A semiconductor integrated circuit comprising:
a first pad allocated to receive an address; and
a second pad allocated to discriminate first and second input/output modes,
wherein the semiconductor integrated circuit supports first and second memory capacities and the first and second input/output modes, and selects the first and second memory capacities and the first and second input/output modes by changing logic levels of the first and second pads,
wherein the first and second input/output modes are differentiated by number of used input/output terminals of the semiconductor integrated circuit.

2. The semiconductor integrated circuit according to claim 1, wherein the second memory capacity corresponds to one-half of the first memory capacity.

3. The semiconductor integrated circuit according to claim 2, wherein the logic levels of the first and second pads can be changed by bonding at least one of the first and second pads to one of a power supply voltage terminal and a ground voltage terminal.

4. The semiconductor integrated circuit according to claim 3, wherein the bonding of at least one of the first and second pads to the power supply voltage terminal or the ground voltage terminal is performed during a packaging process of the semiconductor integrated circuit.

5. The semiconductor integrated circuit according to claim 3, wherein the second pad is bonded to the power supply terminal, in order to support the first memory capacity and the first input/output mode.

6. The semiconductor integrated circuit according to claim 3, wherein the first pad is bonded to the power supply voltage terminal, and the second pad is bonded to the ground voltage terminal, in order to support the first memory capacity and the second input/output mode.

7. The semiconductor integrated circuit according to claim 3, wherein the first pad is bonded to the ground voltage terminal, and the second pad is bonded to the ground voltage terminal, in order to support the second memory capacity and the second input/output mode.

8. The semiconductor integrated circuit according to claim 1, further comprising:
a detector configured to generate a detection signal in response to the logic levels of the first and second pads, and
a column address controller configured to deactivate a column address in response to the detection signal.

9. The semiconductor integrated circuit according to claim 8, wherein the column address is not used when the semiconductor integrated circuit is operates as the second memory capacity.

10. A method for setting of a semiconductor integrated circuit which supports first and second memory capacities and first and second input/output modes comprising:
setting a logic value of a first pad according to a selected one of the first and second memory capacities; and
setting a logic value of a second pad according to a selected one of the first and second input/output modes;
wherein the first and second input/output modes are differentiated by number of used input/output terminals of the semiconductor integrated circuit.

11. The method according to claim 10, wherein the second memory capacity corresponds to one-half of the first memory capacity.

12. The method according to claim 11, wherein the logic level of at least one of the first and second pads is fixed to one of a logic high level and a logic low level.

13. The method according to claim 12, wherein the fixing of at least one of the first and second pads is performed during a packaging process of the semiconductor integrated circuit.

14. The method according to claim 12, wherein the second pad is fixed to the logic high level, in order to support the first memory capacity and the first input/output mode.

15. The method according to claim 12, wherein the first pad is fixed to the logic high level, and the second pad is set to the logic low signal, in order to support the first memory capacity and the second input/output mode.

16. The method according to claim 12, wherein the first pad is fixed to the logic low signal, and the second pad is set to the logic low signal, in order to support the second memory capacity and the second input/output mode.

17. The method according to claim 10, wherein when the first pad is not fixed to at least one of the logic high level and the logic low level, the first pad is configured to receive a row address.

18. The method according to claim 10, further comprising;
generating a detection signal in response to logic levels of the first and second pads; and
deactivating a column address in response to the detection signal.

19. The method according to claim 18, wherein the column address is not used when the semiconductor integrated circuit is operates as the second memory capacity.

* * * * *